United States Patent
Kim et al.

(10) Patent No.: US 9,450,203 B2
(45) Date of Patent: Sep. 20, 2016

(54) ORGANIC LIGHT-EMITTING DIODE DISPLAY WITH GLASS ENCAPSULATION AND PERIPHERAL WELDED PLASTIC SEAL

(71) Applicant: Apple Inc., Cupertino, CA (US)

(72) Inventors: Jinkwang Kim, Cupertino, CA (US); Jungmin Lee, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/580,052

(22) Filed: Dec. 22, 2014

(65) Prior Publication Data

US 2016/0181567 A1 Jun. 23, 2016

(51) Int. Cl.
*H01L 51/56* (2006.01)
*H01L 51/52* (2006.01)
*H01L 27/32* (2006.01)

(52) U.S. Cl.
CPC ......... *H01L 51/5246* (2013.01); *H01L 27/323* (2013.01); *H01L 27/3262* (2013.01); *H01L 51/5237* (2013.01); *H01L 51/5253* (2013.01); *H01L 51/56* (2013.01)

(58) Field of Classification Search
CPC ................................. H01L 51/0545
USPC ............................. 257/40; 438/26
See application file for complete search history.

(56) References Cited

U.S. PATENT DOCUMENTS

| | | | | |
|---|---|---|---|---|
| 5,141,828 | A * | 8/1992 | Bennion | H01M 4/668 205/63 |
| 6,357,880 | B2 * | 3/2002 | Epstein | G02F 1/133553 359/599 |
| 7,928,640 | B2 * | 4/2011 | Fukuda | H01L 51/5284 313/110 |
| 8,557,325 | B2 | 10/2013 | Park | |
| 8,747,178 | B2 | 6/2014 | Seo et al. | |
| 8,871,545 | B2 | 10/2014 | Lee et al. | |
| 8,917,962 | B1 * | 12/2014 | Nichol | G02B 6/0028 362/296.01 |
| 2003/0067565 | A1 * | 4/2003 | Yamamura | G02F 1/133528 349/65 |
| 2006/0061862 | A1 * | 3/2006 | Mi | G02B 5/3058 359/485.05 |
| 2006/0105117 | A1 * | 5/2006 | Kim | C08J 5/18 428/1.1 |
| 2008/0102228 | A1 * | 5/2008 | Kim | C08G 18/3206 428/1.54 |
| 2009/0161045 | A1 * | 6/2009 | Kawamoto | G02B 5/3033 349/98 |
| 2011/0317263 | A1 * | 12/2011 | Yoneyama | B32B 3/20 359/487.06 |
| 2012/0082580 | A1 * | 4/2012 | Tsuboi | F01C 1/16 418/201.3 |
| 2012/0092580 | A1 * | 4/2012 | Dighde | G06F 3/0412 349/58 |
| 2012/0248422 | A1 | 10/2012 | Mine et al. | |
| 2012/0314162 | A1 * | 12/2012 | Ino | G02F 1/133308 349/96 |
| 2014/0246685 | A1 | 9/2014 | Miura et al. | |
| 2016/0136927 | A1 * | 5/2016 | Shin | B32B 7/12 428/304.4 |

\* cited by examiner

*Primary Examiner* — Edward Wojciechowicz
(74) *Attorney, Agent, or Firm* — Treyz Law Group, P.C.; G. Victor Treyz; Zachary D. Hadd

(57) ABSTRACT

A display may have thin-film transistor circuitry that includes organic light-emitting diodes. The thin-film transistor circuitry may be formed on a substrate. First and second thin-film inorganic moisture barrier layers may be deposited on top of the thin-film transistor circuitry. An organic planarization layer may be interposed between the first and second thin-film inorganic moisture barrier layers. A moisture barrier glass layer may be attached to the second thin-film inorganic moisture barrier layer with a layer of liquid adhesive. The display may have functional layers such as a touch sensor and circular polarizer that are interposed between a cover glass layer and the moisture-barrier glass layer. A thermoplastic polymer moisture barrier ring that runs around the peripheral edge of the display may be laser welded between the moisture barrier glass layer and the substrate.

21 Claims, 6 Drawing Sheets

ORGANIC LIGHT-EMITTING DIODE DISPLAY WITH GLASS ENCAPSULATION AND PERIPHERAL WELDED PLASTIC SEAL

BACKGROUND

This relates generally to electronic devices with displays, and, more particularly, to encapsulating displays to protect display components from moisture.

Electronic devices often include displays. Displays such as organic light-emitting diode displays contain organic emissive materials and other structures that are sensitive to moisture. To prevent moisture intrusion, some organic light-emitting diode displays include deposited thin-film moisture barrier layers. The thin-film moisture barrier layers may be formed from materials such as silicon nitride that are impermeable to water.

A display may also contain an inorganic barrier layer that is attached to underlying display layers with a layer of pressure sensitive adhesive. Inorganic barrier layers formed on pressure sensitive adhesive in this way tend to exhibit poor water blocking capabilities. Pressure sensitive adhesive is associated with high water diffusivity and low water solubility, so large amounts of moisture can also intrude into a display through the edges of a pressure sensitive adhesive layer. Moisture barrier layers that are not formed on pressure sensitive adhesive may be better able to withstand moisture, but are not perfect and can still allow moisture to penetrate to sensitive organic material layers in a display. For example, these moisture barrier layers may not be able to block all moisture that has penetrated through the edges of a pressure sensitive adhesive layer and the inorganic moisture barrier layer on top of the pressure sensitive adhesive layer.

It would therefore be desirable to be able to provide moisture barrier structures for preventing moisture intrusion into a display such as an organic light-emitting diode display.

SUMMARY

A display may have thin-film transistor circuitry that includes an array of organic light-emitting diodes. The thin-film transistor circuitry may be formed on a substrate. The thin-film transistor circuitry may be covered with moisture barrier structures, functional layers, and a cover glass layer. A moisture-barrier ring that is formed from a thermoplastic polymer may surround the thin-film transistor circuitry.

The moisture barrier structures may include first and second inorganic thin-film moisture-barrier layers such as layers of silicon nitride. The first and second thin-film inorganic moisture barrier layers may be deposited on top of the thin-film transistor circuitry. An organic planarization layer may be interposed between the first and second thin-film inorganic moisture barrier layers.

A moisture barrier glass layer may be attached to the second thin-film inorganic moisture barrier layer with a layer of liquid adhesive. The moisture barrier glass layer may be a layer of bulk glass such as silica glass with a thickness of 10-50 microns. The display may have functional layers such as a touch sensor and circular polarizer that are interposed between a cover glass layer and the moisture-barrier glass layer. The thermoplastic polymer moisture barrier ring may run around the peripheral edge of the display and may be laser welded between the moisture barrier glass layer and the substrate.

DETAILED DESCRIPTION

Figure 1:
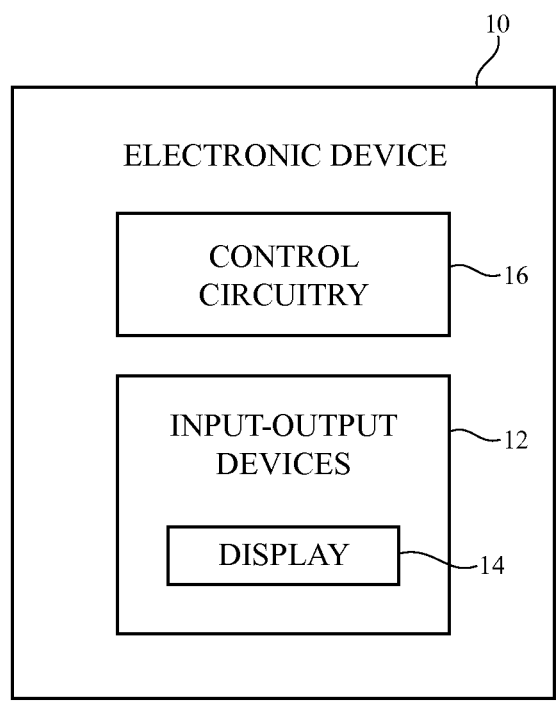
FIG. 1 is a schematic diagram of an illustrative electronic device having a display in accordance with an embodiment.

An illustrative electronic device of the type that may be provided with a display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 using an array of pixels in display 14.

Device 10 may be a tablet computer, laptop computer, a desktop computer, a display, a cellular telephone, a media player, a wristwatch device or other wearable electronic equipment, or other suitable electronic device.

Display 14 may be an organic light-emitting diode display or may be a display based on other types of display technology. Configurations in which display 14 is an organic light-emitting diode display are sometimes described herein as an example. This is, however, merely illustrative. Any suitable type of display may be used, if desired.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
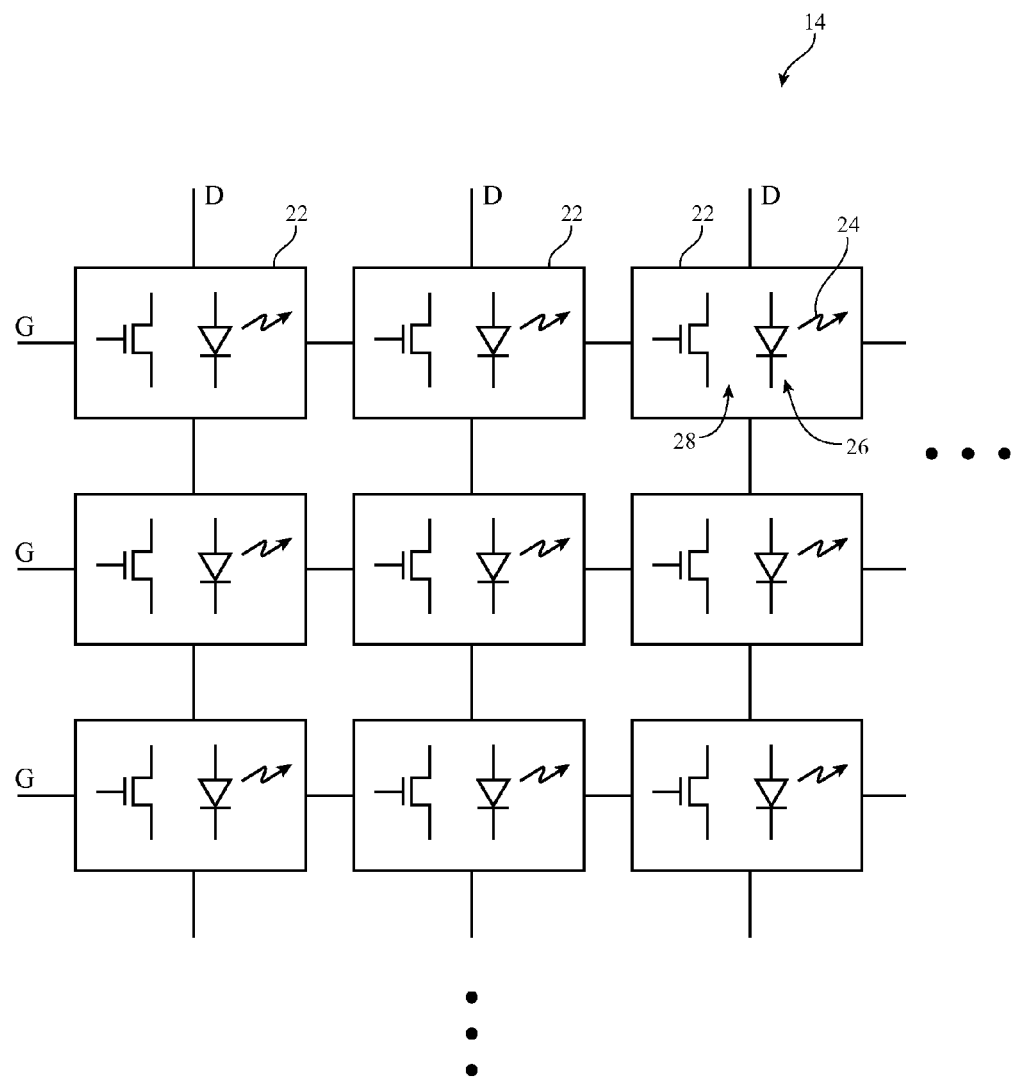
FIG. 2 is a top view of an illustrative display in an electronic device in accordance with an embodiment.

A top view of a portion of display 14 is shown in FIG. 2. As shown in FIG. 2, display 14 may have an array of pixels 22. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may have a light-emitting diode 26 that emits light 24 under the control of a pixel control circuit formed from thin-film transistor circuitry such as thin-film transistors 28 and thin-film capacitors). Thin-film transistors 28 may be polysilicon thin-film transistors, semiconducting-oxide thin-film transistors such as indium zinc gallium oxide transistors, or thin-film transistors formed from other semiconductors.

Figure 3:
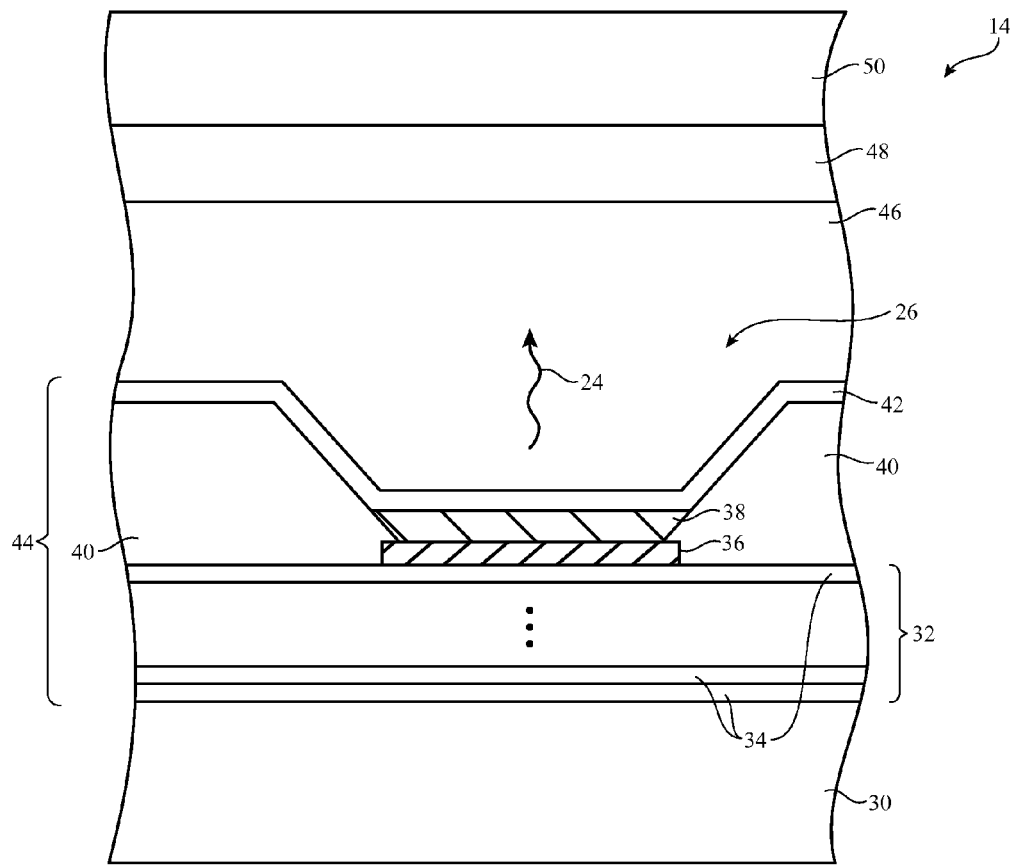
FIG. 3 is a cross-sectional side view of a portion of an illustrative organic light-emitting diode display in accordance with an embodiment.

A cross-sectional side view of an illustrative organic light-emitting diode display is shown in FIG. 3. As shown in FIG. 3, display 14 may include a substrate layer such as substrate layer 30. Substrate 30 may be a planar layer or a non-planar layer and may be formed from plastic, glass, ceramic, sapphire, or other suitable materials. Configurations for display 14 in which substrate 30 is formed from a material such as plastic are sometimes described herein as an example.

Thin-film transistor circuitry 44 may be formed on substrate 30. Thin film transistor circuitry 44 may include anode structures such as anode 36 on layers 34. Layers 34 may include semiconductor layers, metal layers, and dielectric layers that form circuitry 32. Circuitry 32 may include transistors and capacitors for controlling light-emitting diodes such as light emitting diode 26 of FIG. 3. During operation, light-emitting diode 26 may emit light 24.

Light-emitting diode 26 may be formed within an opening in pixel definition layer 40. Pixel definition layer 40 may be formed from a patterned photoimageable polymer. In each light-emitting diode, organic emissive material 38 is interposed between a respective anode 36 and cathode 42. Anodes 36 may be patterned from a layer of metal on circuitry 32. Cathode 42 may be formed from a common conductive layer that is deposited on top of pixel definition layer 40. Cathode 42 is transparent so that light 24 may exit light emitting diode 26.

Organic light-emitting diode display structures such as emissive material 38 and other thin-film transistor circuitry 44 may be sensitive to moisture. Accordingly, thin-film transistor circuitry 44 may be covered with a layer of moisture barrier structures. For example, thin-film transistor circuitry 44 may be covered with moisture barrier structures 46. Structures 46 may include one or more moisture barrier layers, planarization layers, adhesive layers, buffer layers, and other structures. To help minimize moisture permeation, the use of pressure sensitive adhesive in structures 46 may be minimized. Moisture may also be blocked by incorporating a thin layer of glass into structures 46. The glass layer may be formed from a bulk glass material rather than a thin-film layer deposited using thin-film deposition techniques. This helps eliminate defects and thereby enhances moisture resistance.

Display 14 may have a protective outer display layer such as cover glass layer 50. The outer display layer maybe formed from a material such as sapphire, glass, plastic, clear ceramic, or other transparent material. Configurations in which the outermost layer of display 14 is formed from a clear layer of glass are sometimes described herein as an example. This is merely illustrative. In general, the outermost layer of display 14 may be formed from any suitable material and may be formed form a thickness sufficient to provide display 14 with damage from scratches, etc. For example, cover glass 50 may have a thickness of 0.05 to 2 mm, 0.1 to 0.5 mm, etc.

If desired, display 14 may include functional layers 48. Functional layers 48 may include a touch sensor layer, a circular polarizer layer, and other layers. A circular polarizer layer may help reduce light reflections from metal traces in thin-film transistor circuitry 44. A touch sensor layer may be formed from an array of capacitive touch sensor electrodes on a flexible polymer substrate. The touch sensor layer may be used to gather touch input from the fingers of a user, from a stylus, or from other external objects. Layers of optically clear adhesive may be used to attach cover glass layer 50 and functional layers 48 to underlying display layers such as moisture barrier structures 46, thin-film transistor circuitry 44, and substrate 30.

Figure 4:
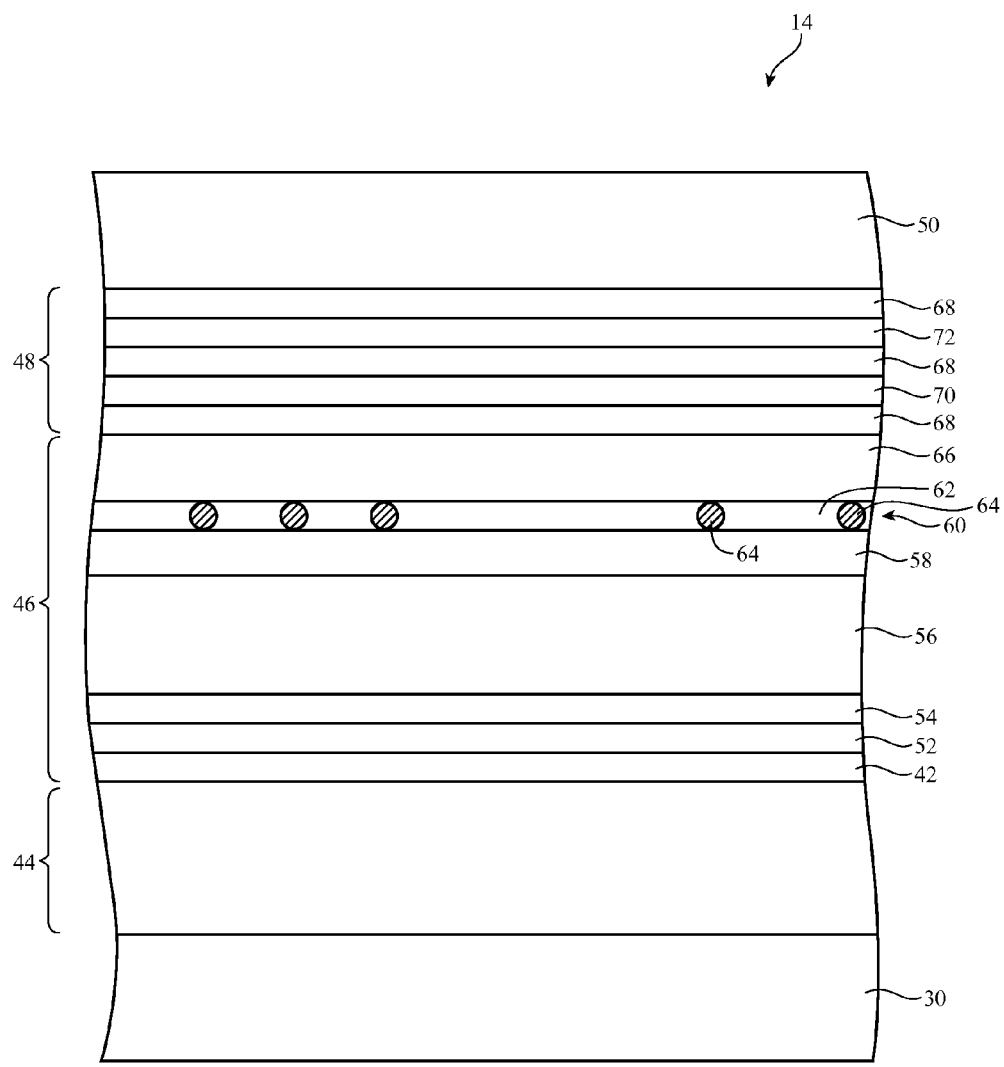
FIG. 4 is cross-sectional side view of a portion of an illustrative organic light-emitting diode display that includes a glass moisture barrier layer in accordance with an embodiment.

A cross-sectional side view of display 14 in a configuration in which a thin layer of glass is used to help prevent moisture permeation is shown in FIG. 4. As shown in FIG. 4, thin-film transistor circuitry 44 may be formed on substrate 30. Moisture barriers structures 46 may be formed on cathode layer 42 and other thin-film transistor circuitry. Functional layers 48 may be interposed between cover glass layer 50 and moisture barrier structures 46.

Moisture barrier structures 46 may include a thin layer of glass such as glass layer 66. Glass layer 66 may be formed from bulk glass material and may have a thickness of 10-50 microns, 5-100 microns, less than 70 microns, more than 2 microns, more than 5 microns, less than 30 microns, or other suitable thickness.

Cathode 42 maybe covered with a capping layer such as capping layer 52. Capping layer 52 may be a transparent inorganic layer that helps protect cathode 42. A first inorganic moisture barrier layer such as moisture barrier layer 54 may be deposited on capping layer 52. Moisture barrier layer 54 may be formed from silicon nitride or other inorganic materials that are impermeable to moisture.

An organic buffer layer such as organic planarization layer 56 may be formed on moisture barrier layer 54. Planarization layer 56 serves as a compliance layer that covers particles in the lower layers of display 14, but does not block moisture. A second moisture barrier layer such as moisture barrier layer 58 may be formed on planarization layer 56. Moisture barrier layer 58 maybe a thin-film silicon nitride layer or a layer of other inorganic material that is deposited on the layers of display 14 after depositing planarization layer 56.

Moisture barrier glass layer 66 may be attached to the other layers of structures 46 such as moisture barrier layer 58 using a thin layer of adhesive such as adhesive layer 60.

Adhesive layer 60 may have a thickness of about 3 microns, 1 to 5 microns, more than 1 micron, less than 10 microns, or other suitable thickness. Layer 60 may be formed from a layer of liquid adhesive 62 that contains index-matched microspheres 64. Microspheres 64 may have an index of refraction that is the same as that of liquid adhesive 62 so that microspheres 64 do not scatter light 24. The diameter of microspheres 64 may be selected to adjust the thickness of adhesive layer 60 to a desired value. For example, if adhesive layer 60 is to have a thickness of 3 microns, microspheres 64 may be selected that have diameters of 3 microns. Liquid adhesive 62 may be optically clear epoxy that is cured using exposure to ultraviolet light or other suitable adhesive.

Layers of optically clear adhesive 68 may be used to attach functional layers 48 between cover glass 50 and moisture barrier structures 46. As shown in FIG. 4, for example, layers such as touch sensor layer 72 and circular polarizer 70 may be attached to the lower surface of cover glass 50 using optically clear adhesive 68. Optically clear adhesive 68 may also be used to attach functional layers 48 to the upper surface of moisture barrier glass layer 66. Optically clear adhesive 68 may be a liquid optically clear adhesive or maybe an optically clear adhesive film. Functional films 48 may have a thickness of about 500 microns or other suitable thickness.

Figure 5:
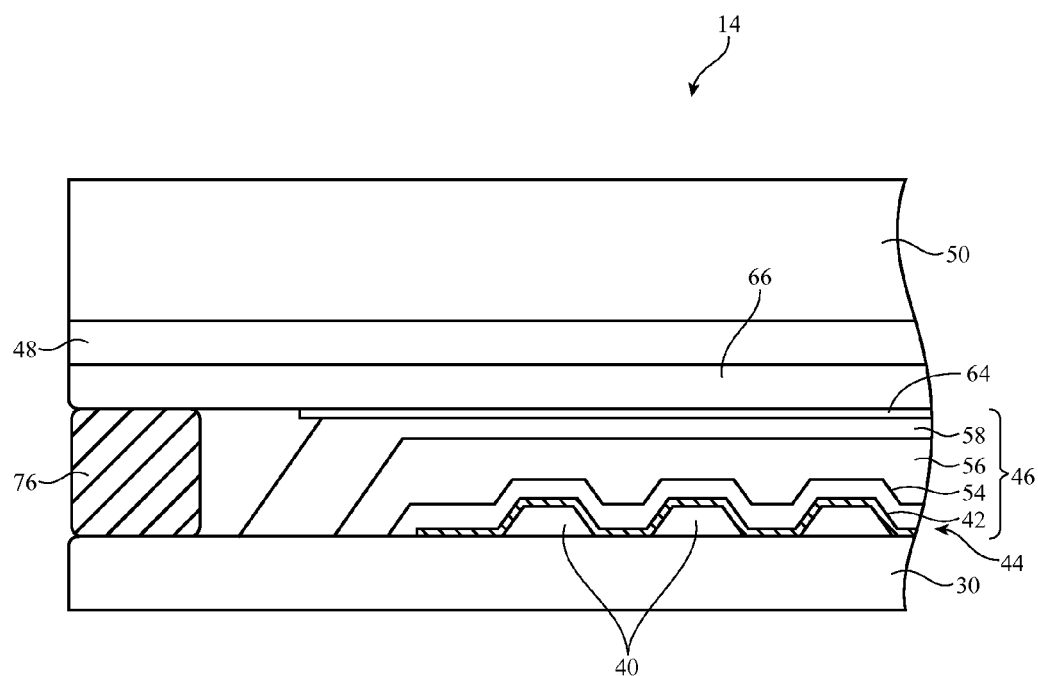
FIG. 5 is a cross-sectional side view of an edge portion of an illustrative organic light-emitting diode display having a welded plastic moisture barrier ring to block moisture in accordance with an embodiment.

To help ensure that moisture does not penetrate display 14 through the edges of display 14, the peripheral edge of display 14 may be provided with a solid plastic moisture barrier ring. This type of arrangement is shown in the cross-sectional side view of display 14 in FIG. 5. As shown in FIG. 5, thin-film transistor circuitry 44 may be formed on the upper surface of substrate 30. Moisture barrier structures 46 may be formed on top of thin-film transistor circuitry 44. Functional layers 48 may be interposed between cover glass layer 50 and glass layer 66 of moisture barrier structures 46. Adhesive layer 64 may be used to attach glass layer 66 to underlying structures such as moisture barrier layer 58.

The periphery of display 14 may be sealed against moisture using moisture barrier ring 76. Ring 76 may have a rectangular ring shape that surrounds pixels 22 (FIG. 2) and that runs along the periphery of display 14 between layer 66 and substrate 30 (and/or layers on substrate 30). Ring 76 may be formed from a polymer that is impervious to moisture such as a dense thermoplastic polymer. Light 24 does not pass through ring 76, so the plastic material that makes up ring 76 need not be transparent. Ring 76 may have a thickness of 0.5 mm to 2 mm, 1.0 mm to 2 mm, more than 1 mm, less than 3 mm, or other suitable thickness. Techniques such as laser welding techniques may be used to attach ring 76 within display 14.

Figure 6:
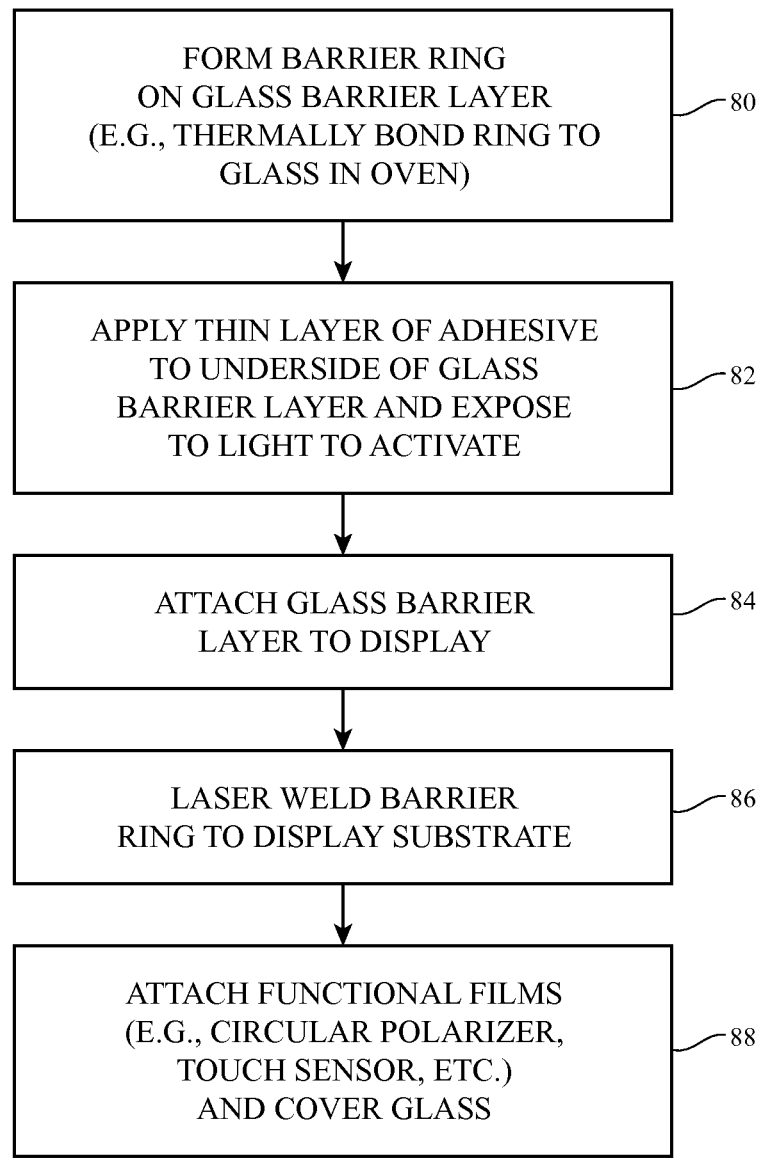
FIG. 6 is a flow chart of illustrative steps involved in forming a display in accordance with an embodiment.

A flowchart of illustrative steps involved in forming display 14 is shown in FIG. 6.

At step 80, plastic moisture barrier ring 76 may be formed on glass moisture barrier layer 66. For example, plastic moisture barrier ring 76 may be attached along the edges of glass layer 66 by heating ring 76 and glass layer 66 in an oven. Because sensitive structures such as the emissive material and other structures of thin-film transistor circuitry 44 are not present during the operations of step 80, the plastic material that forms ring 76 may, if desired, have a relatively high melting temperature (e.g., 250-350° C., 300° C., more than 275° C., less than 400° C., etc.).

At step 82, a thin layer of adhesive such as adhesive layer 64 may be applied to the underside of glass moisture barrier layer 66. Adhesive layer 64 may be applied in liquid form and may, if desired, contain index-matched microparticles that serve as spacers to help ensure that glass layer 66 is separated from moisture barrier layer 58 by a desired amount of adhesive. Following application of a thin liquid layer of adhesive 64, layer 64 may be exposed to ultraviolet light to activate adhesive layer 64.

After adhesive layer 64 has been applied, glass layer 66 and ring 76 may be attached to the other layers of display 14 (step 84). Adhesive 64 may be cured at room temperature and/or adhesive 64 may be cured by exposing adhesive 64 to heat and/or light (as examples).

During the operations of step 86, a laser may be used to weld ring 76 between glass layer 66 and substrate 30. The laser may emit light that passes through transparent display layers during welding. For example, laser light may pass through glass layer 66 during welding. The laser welding process preferably only produces heat locally in the vicinity of the applied laser beam and ring 76, thereby avoiding heat-induced damage to thin-film transistor circuitry 44.

After ring 76 has been welded into place to seal the periphery of display 14 against moisture, the remaining portions of display 14 may be assembled. In particular, optically clear adhesive 68 may be use to attach touch sensor 72, circular polarizer 70, or other functional films 48 between cover glass layer 50 and glass layer 66 (step 88).

The foregoing is merely illustrative and various modifications can be made by those skilled in the art without departing from the scope and spirit of the described embodiments. The foregoing embodiments may be implemented individually or in any combination.

What is claimed is:

1. A display having a peripheral edge, comprising:
first and second display layers;
thin-film transistor circuitry between the first and second display layers, wherein thin-film transistor circuitry comprises light-emitting diodes;
a moisture-barrier ring of thermoplastic polymer that is attached between the first and second display layers to prevent moisture from reaching the thin-film transistor circuitry, wherein the first display layer comprises a substrate layer on which the thin-film transistor circuitry is formed; and
a polarizer, wherein the second display layer is interposed between the polarizer and the first display layer, and wherein the moisture-barrier ring extends between the substrate layer and the second display layer to seal the peripheral edge of the display.

2. The display defined in claim 1
wherein the second display layer comprises a moisture-barrier glass layer, wherein the moisture-barrier ring is laser welded between the substrate layer and the moisture-barrier glass layer.

3. The display defined in claim 2 further comprising a layer of liquid adhesive between the moisture-barrier glass layer and the thin-film transistor circuitry.

4. The display defined in claim 3 further comprising first and second moisture barrier layers interposed between the thin-film transistor layer and the moisture-barrier glass layer.

5. The display defined in claim 4 further comprising an organic layer between the first and second moisture barrier layers.

6. The display defined in claim 5 wherein the first and second moisture barrier layers are deposited thin-film inorganic layers.

7. The display defined in claim 6 wherein the first and second moisture barrier layers are silicon nitride layers.

8. The display defined in claim 6 wherein the moisture barrier glass layer comprises a layer of bulk glass having a thickness of 10 to 50 microns.

9. The display defined in claim 1 wherein the light-emitting diodes comprise organic light-emitting diodes.

10. The display defined in claim 9 wherein the second layer comprises a moisture-barrier glass layer, the display further comprising:
a thin-film inorganic moisture barrier layer between the moisture-barrier glass layer and the thin-film transistor circuitry; and
a layer of liquid adhesive between the moisture-barrier glass layer and the thin-film transistor circuitry.

11. The display defined in claim 10 wherein the layer of liquid adhesive includes index-matched microspheres.

12. The display defined in claim 10 further comprising:
a cover glass layer.

13. The display defined in claim 12 further comprising at least one layer of optically clear adhesive interposed between the cover glass layer and the moisture-barrier glass layer.

14. The display defined in claim 12 further comprising:
a touch sensor between the cover glass layer and the moisture-barrier glass layer, wherein the polarizer comprises a circular polarizer between the cover glass layer and the moisture-barrier glass layer.

15. The display defined in claim 14 further comprising optically clear adhesive that attaches the cover glass layer to the touch sensor, that attaches the touch sensor to the circular polarizer, and that attaches the circular polarizer to the moisture-barrier glass layer.

16. A method of forming a display that has a peripheral edge, comprising:
forming thin-film transistor circuitry on a display substrate, wherein the thin-film transistor circuitry includes organic light-emitting diodes;
depositing an inorganic moisture barrier layer over the thin-film transistor circuitry;
applying a layer of adhesive to a moisture-barrier glass layer;
attaching the moisture-barrier glass layer to the inorganic moisture barrier layer with the layer of adhesive such that the inorganic moisture barrier layer is interposed between the moisture barrier glass layer and the thin-film transistor circuitry; and
attaching a thermoplastic ring around the peripheral edge between the moisture-barrier glass layer and the display substrate so that the thermoplastic ring surrounds the organic light-emitting diodes.

17. The method defined in claim 16 wherein attaching the thermoplastic ring comprises laser welding the thermoplastic ring around the peripheral edge, the method further comprising:
depositing the inorganic moisture barrier layer over the thin-film transistor circuitry;
depositing an organic planarization layer over the inorganic moisture barrier layer; and
depositing an additional inorganic moisture barrier layer over the organic planarization layer.

18. The method defined in claim 17 further comprising:
attaching the moisture-barrier glass layer to the additional inorganic moisture barrier layer with a layer of adhesive.

19. An organic light-emitting diode display, comprising:
a substrate layer;
thin-film transistor circuitry including organic light-emitting diodes on the substrate layer;
a first thin-film moisture barrier layer on the thin-film transistor circuitry;
an organic planarization layer on the first thin-film moisture barrier layer;
a second thin-film moisture barrier layer on the thin-film transistor circuitry;
a moisture-barrier glass layer; and
a thermoplastic polymer moisture-barrier ring that is attached between the substrate layer and the moisture-barrier glass layer and that surrounds the thin-film transistor circuitry.

20. The display defined in claim 19 wherein the thermoplastic polymer moisture-barrier ring is laser welded between the moisture-barrier glass layer and the substrate, the display further comprising:
a layer of liquid adhesive that attaches the moisture barrier glass layer to the second thin-film moisture-barrier layer;
a cover glass layer; and
functional layers interposed between the cover glass layer and the moisture-barrier glass layer.

21. The display defined in claim 20 wherein the functional layers include a touch sensor layer attached to the cover glass layer with optically clear adhesive.

* * * * *